(12) United States Patent
Moore

(10) Patent No.: US 7,030,410 B2
(45) Date of Patent: *Apr. 18, 2006

(54) RESISTANCE VARIABLE DEVICE

(75) Inventor: John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/920,333

(22) Filed: Aug. 18, 2004

(65) Prior Publication Data
US 2005/0019699 A1 Jan. 27, 2005

Related U.S. Application Data

(60) Continuation of application No. 10/660,602, filed on Sep. 12, 2003, now Pat. No. 6,833,559, which is a division of application No. 09/779,983, filed on Feb. 8, 2001, now Pat. No. 6,638,820.

(51) Int. Cl.
H01L 29/04 (2006.01)

(52) U.S. Cl. .......................... 257/52; 257/49; 257/245; 257/246; 438/102; 438/292

(58) Field of Classification Search ............... 257/49, 257/52, 245, 246; 438/102, 292, 652, 653
See application file for complete search history.

(56) References Cited

U.S. PATENT DOCUMENTS 3,271,591 A    9/1966   Ovshinsky
3,622,319 A   11/1971   Sharp (Continued)

FOREIGN PATENT DOCUMENTS

JP           56126916     10/1981
WO        WO 97/48032    12/1997

(Continued)

OTHER PUBLICATIONS

Abdel–All, A.; Elshafie, A.; Ethawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

(Continued)

Primary Examiner—Christian Wilson
(74) Attorney, Agent, or Firm—Dickstein Shapiro Morin & Oshinsky LLP

(57) ABSTRACT

A method of precluding diffusion of a metal into adjacent chalcogenide material upon exposure to a quanta of actinic energy capable of causing diffusion of the metal into the chalcogenide material includes forming an actinic energy blocking material layer over the metal to a thickness of no greater than 500 Angstroms and subsequently exposing the actinic energy blocking material layer to said quanta of actinic energy. In one implementation, an homogenous actinic energy blocking material layer is formed over the metal and subsequently exposed to said quanta of actinic energy. A method of forming a non-volatile resistance variable device includes providing conductive electrode material over chalcogenide material having metal ions diffused therein. An actinic energy blocking material layer is formed on the conductive electrode material, the actinic energy blocking material layer being effective to shield actinic energy from reaching an interface of the conductive electrode material and the actinic energy blocking material to substantially preclude diffusion of the conductive electrode material into the chalcogenide material upon exposure to said actinic energy. A dielectric layer is formed on the actinic energy blocking material layer. The conductive electrode material is formed into a first electrode. A second electrode is provided proximate the chalcogenide material having the metal diffused therein. Non-volatile resistance variable devices manufacture by these and other methods are contemplated.

32 Claims, 3 Drawing Sheets

U.S. PATENT DOCUMENTS

| | | | |
|---|---|---|---|
| 3,656,029 A * | 4/1972 | Ahn et al. ............... 257/2 |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,296,716 A | 3/1994 | Ovshinsky et al. |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,825,046 A | 10/1998 | Czubatyj et al. |
| 5,841,150 A | 11/1998 | Gonzalez et al. |
| 5,846,889 A | 12/1998 | Harbison et al. |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,429,064 B1 | 8/2002 | Wicker |
| 6,437,383 B1 | 8/2002 | Xu |
| 6,462,984 B1 | 10/2002 | Xu et al. |
| 6,469,364 B1 | 10/2002 | Kozicki |
| 6,480,438 B1 | 11/2002 | Park |
| 6,487,106 B1 * | 11/2002 | Kozicki ............... 365/153 |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B1 | 1/2003 | Hudgens et al. |
| 6,511,867 B1 | 1/2003 | Lowery et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowery et al. |
| 6,555,860 B1 | 4/2003 | Lowery et al. |
| 6,563,164 B1 | 5/2003 | Lowery et al. |
| 6,566,700 B1 | 5/2003 | Xu |
| 6,567,293 B1 | 5/2003 | Lowery et al. |
| 6,569,705 B1 | 5/2003 | Chiang et al. |
| 6,570,784 B1 | 5/2003 | Lowery |
| 6,576,921 B1 | 6/2003 | Lowery |
| 6,586,761 B1 | 7/2003 | Lowery |
| 6,589,714 B1 | 7/2003 | Maimon et al. |
| 6,590,807 B1 | 7/2003 | Lowery |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowery et al. |
| 6,638,820 B1 * | 10/2003 | Moore ............... 438/256 |
| 6,642,102 B1 | 11/2003 | Xu |
| 6,646,297 B1 | 11/2003 | Dennison |

| | | |
|---|---|---|
| 6,649,928 B1 | 11/2003 | Dennison |
| 6,667,900 B1 | 12/2003 | Lowrey et al. |
| 6,671,710 B1 | 12/2003 | Ovshinsky et al. |
| 6,673,648 B1 | 1/2004 | Lowrey |
| 6,673,700 B1 | 1/2004 | Dennison et al. |
| 6,674,115 B1 | 1/2004 | Hudgens et al. |
| 6,687,153 B1 | 2/2004 | Lowery |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 6,833,559 B1 * | 12/2004 | Moore .................... 257/52 |
| 2002/0000666 A1 | 1/2002 | Kozicki et al. |
| 2002/0072188 A1 | 6/2002 | Gilton |
| 2002/0123169 A1 | 9/2002 | Moore et al. |
| 2002/0123248 A1 | 9/2002 | Moore et al. |
| 2002/0168820 A1 | 11/2002 | Kozicki |
| 2003/0027416 A1 | 2/2003 | Moore et al. |
| 2003/0045049 A1 | 3/2003 | Campbell et al. |
| 2003/0045054 A1 | 3/2003 | Campbell et al. |
| 2003/0048744 A1 | 3/2003 | Ovshinsky et al. |
| 2003/0049912 A1 | 3/2003 | Campbell et al. |
| 2003/0050124 A1 | 3/2003 | Kanamaru et al. |
| 2003/0107105 A1 | 6/2003 | Kozicki |
| 2003/0137869 A1 | 7/2003 | Kozicki |
| 2003/0143782 A1 | 7/2003 | Gilton et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | WO 00/48196 | 8/2000 |
| WO | WO 02/21542 | 3/2002 |
| WO | WO 99/28914 | 6/1999 |

OTHER PUBLICATIONS

Adler, D.; Henisch, H.K.; Motts, S.N., The mechanism of threshold switching in amorphous alloys, Rev. Mod. Phys. 50 (1978) 209–220.

Afifi, M.A.; Labib, H.H.; El–Fazary, M.H.; Fadel, M.,. Electrical and thermal properties of chalgogenide glass system Se75Ge25–xSbx, Appl. Phys. A 55 (1992) 167–169.

Afifi, M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett 62 (1989) 808–810.

Axon Technologies Corporation, Technology Description: *Programmable Metalization Cell(PMC)*, pp. 1–6 (Pre–May 2000).

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, State solid Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2–xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structure origin of broken chemical order in a GeSe2 glass, Phys. Rev. B 25 (1982) 2975–2978.

Boolchand, P.; Grothaus, J.; Phillips, J.C., Broken chemical order and phase separation in GexSe–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Cherynak, L.; Gartsman, K.; Jakubowicz, A., Room–Temperature, electric field induced creation of stable devices in CuInSe 2 Crystals, Science 258 (1992) 271–274.

Chatterjee, R.; Asokan, S.; Titus, S.S.K., Current–controlled negative–resistance behavior of memory switching in bulk As–Te–Se glasses, J. Phys. D: Appl. Phys. 27 (1994) 2624–2627.

Chen, C.H.; Tai, K.L. , Whisker growth induced by Ag photodoping in glassy GexSe-x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta Ag2Se from 4.2 to 300K, J. Appl. Phys. 38 (1967) 753–756.

Das et al., Theory of the characteristic curves of the silver chalcogenide glass inorganic photoresists, 54 Appl. Phys. Lett., No. 18, pp. 1745–1747 (1989).

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchiari, B.; Bernede, J.C.; Burgaud, P., Properties of Ag2-xSe1+x/n–Si diodes, Thin Solid Films 119 (1983) 107–113.

El Gharras, Z.; Bourahla, A.; Vautier, C., Role of photoinduced defects in amorphous GexSe1-x photoconductivity, J. Non–Cryst. Solids 155 (1993) 171–179.

El Ghrandi, R.; Calas J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80-x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ; Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C.; Conductivity and crystallization of amorphous selenium, Phys. Stat. Sol. (a) 64 (1981) 311–316.

Fritzche, H, Optical and electrical energy gaps in amorphous semiconductor, J. Non–Cryst. Solids 6 (1971) 49–71.

Fritzsche, H., Electric phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metals/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Helbert et al., *Intralevel hybrid resist process with submicron capability,* SPIE vol. 333 Submicron Lithography, pp. 24–29 (1982).

Hilt, Dissertation: *Materials characterization of Silver Chalcogenide Programmable Metalization Cells,* Arizona State University, pp. Title page–114 (UMI Company, May 1999).

Hirose et al., *High Speed Memory Behavior and Reliability of an Amorphous $As_2 S_3$ Film Doped Ag,* Phys. Stat. Sol. (a) 61, pp. 87–90 (1980).

Hirose, Y.; Hirose, H., Polarity–dependent memory switching and behavior of Ag dendrite in Ag–photodoped amorphous As2S3 films, J. Appl. Phys. 47 (1976) 2767–2772.

Holmquist et al., *Reaction and Diffusion in Silver–Arsenic Chalcogenide Glass Systems,* 62 J. Amer. Ceram. Soc., No. 3–4, pp. 183–188 (Mar.–Apr. 1979).

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B. 74 (1996) 37–50.

Hu, J.; Snell, A.J.; Hajto, J.; Owen, A.E., Current–induced instability in Cr–p+a–Si:H–V thin film devices, Phil Mag. B 80 (2000) 29–43.

Huggett et al., *Development of silver sensitized germanium selenide photoresist by reactive sputter etching in $SF_6$,* 42 Appl. Phys. Lett., No. 7, pp. 592–594 (Apr. 1983).

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi et al., *Mechanism of photosurface deposition,* 164–166 J. Non–Cryst. Solids, pp. 1231–1234 (1993).

Kawaguchi, T.; Maruno, S.; Elliott, S.R., Optical, electrical, and structural properties of amorphous Ag–Ge–S and Ag–Ge–Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1–x (0<=x<0.571) glasses, Solids state Ionics 123 (1999) 259–269.

Kluge, G.; Thomas, A.; Klabes, R.; Grotzschel, R., Silver photodiffusion in amorphous GexSe100–x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N; Andreichin, R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalgogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frankel conduction, Phys. Stat. Sol. (a) 29 (1975) K129–K132.

Leung, W.; Cheung, N.; Neureuther, A.R., Photoinduced diffusion of Ag in GexSe1–x glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185–C2–188.

McHardy et al., *The dissolution of metals in amorphous chalcogenides and the effects o electron and ultraviolet radiation*, 20 J. Phys. C.: Solid State Phys., pp. 4055–4075 (1987)f.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and Ionic conduction in (AgxCu1–x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mizusaki et al., Kinetic Studies on the Selenization of Silver, 47 Bull. Chem. Soc. Japan No. 11, pp. 2851–2855 (Nov. 1974).

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1–x amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed.–20 (1973) 195–209.

Ovshinsky S.R.; Fritzche, H., Reversible structural transformations in amorphous semiconductors for memory and logic, Metallurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Owen et al., *Metal–Chalcogenide Photoresists for High Resolution Lithography and Sub–Micron Structures*, Nanostructure Physics and Fabrication, pp. 447–451 (M. Reed ed. 1989).

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni, K.S.; Golpal, E.S.R., Electrical Switching in germanium telluride glasses doped with Cu and Ag, Appl. Phys. A 69 (1999) 421–425.

Rose, J.J.; Hajto, J.;Lecomber,P.G.;Gage,S.M.;Choi,W.K-.;Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a –Si:H memory devices, Mat. Res. Soc. Symp. Proc. V 258, 1992, 1075–1080.

Safran et al., TEM tudy of $Ag_2$ Se developed by the reaction of poly crystalline silver films and selenium, 317 Thin Solid Films, pp. 72–76 (1998).

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Shimizu et al., *The Photo–Erasable Memory Switching Effect of Ag Photo–Doped Chalcogenide Glasses*, 46 B Chem Soc. Japan, No. 12, pp. 3662–3365 (1973).

Snell, A.J.; Lecomber, P.G.; Hajto, J.; Rose, M.J.; Owen, A.E.; Osborne, I.L., Analogue memory effects in metal/a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1993, 1017–1021.

Somogyi et al., Temperature Dependence of the Carrier Mobility in $Ag_2$ Se Layers Grown on NaCl and $SiO_x$ Substrates, 74 Acta Physica Hungarica, No. 3, pp. 243–255 (1994).

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tai et al., Multilevel Ge–Se film based resist systems, SPIE vol. 333 Submicron Lithography, pp. 32–39 (Mar. 1982).

Tai et al., Submicron optical lithography using an inorganic resist/polymer bilevel scheme, 17 J. Vac. Sci. Technol., No. 5, pp. 1169–1176 (Sep./Oct. 1980).

Tanaka, K., Ionic and mixed conductors in Ag photodoping process, Mod. Phys. Lett B 4 (1990) 1373–1377.

Tanaka, K.; ;Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant,S.;–Peytavin,S.;Ribes,M.;Flank,A.M.;Dexpert, H.;Lagarde,J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. .Non–Cryst. Solids 117–118 (1990) 219–221.

Uttecht, R.; Steventon, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, G.; Fleury, G., Anatomous behavior of amorphous selenium films, J. Non–Cryst. Solids 33 (1976) 267–272.

Vodenicharov, C.; Parvanov,S.; Petkov,P., Electrode–limited currents in the thin–film M–GeSe–M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Yoshikawa, et al., A new inorganic electron resist of high contrast, 31 App. Phys. Lett., No. 3, pp. 161–163 (Aug. 1977).

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Kawamoto, Yoji And Nishida, Masaru, Ionic Conduction in $As_2S_3$—$Ag_2S$, $GeS_2$—GeS—$Ag_2S$ and $P_2S_5$—$Ag_2S$ Glasses, Journal of Non–Crystalline Solids 20 (1976) 393–404.

* cited by examiner

RESISTANCE VARIABLE DEVICE

CROSS-REFERENCE TO RELATED APPLICATIONS

This application is a continuation of U.S. patent application Ser. No.: 10/660,602, filed on Sep. 12, 2003 U.S. Pat. No. 6,833,559, which in turn is a divisional of U.S. patent application Ser. No.: 09/779,983, filed on Feb. 8, 2001, now U.S. Pat. No. : 6,638,820. Both applications are incorporated herein by reference.

TECHNICAL FIELD

This invention relates to non-volatile resistance variable devices and methods of forming the same, and to methods of precluding diffusion of a metal into adjacent chalcogenide material.

BACKGROUND OF THE INVENTION

Semiconductor fabrication continues to strive to make individual electronic components smaller and smaller, resulting in ever denser integrated circuitry. One type of integrated circuitry comprises memory circuitry where information is stored in the form of binary data. The circuitry can be fabricated such that the data is volatile or non-volatile. Volatile storing memory devices result in loss of data when power is interrupted. Non-volatile memory circuitry retains the stored data even when power is interrupted.

This invention was principally motivated in making improvements to the design and operation of memory circuitry disclosed in the Kozicki et al. U.S. Pat. Nos. 5,761, 115; 5,896,312; 5,914,893; and 6,084,796, which ultimately resulted from U.S. patent application Ser. No. 08/652,706, filed on May 30, 1.996, disclosing what is referred to as a programmable metalization cell. Such a cell includes opposing electrodes having an insulating dielectric material received therebetween. Received within the dielectric material is a fast ion conductor material. The resistance of such material can be changed between highly insulative and highly conductive states. In its normal high resistive state, to perform a write operation, a voltage potential is applied to a certain one of the electrodes, with the other of the electrode being held at zero voltage or ground. The electrode having the voltage applied thereto functions as an anode, while the electrode held at zero or ground functions as a cathode. The nature of the fast ion conductor material is such that it undergoes a chemical and structural change at a certain applied voltage. Specifically, at some suitable threshold voltage, plating of metal from metal ions within the material begins to occur on the cathode and grows or progresses through the fast ion conductor toward the other anode electrode. With such voltage continued to be applied, the process continues until a single conductive dendrite or filament extends between the electrodes, effectively interconnecting the top and bottom electrodes to electrically short them together.

Once this occurs, dendrite growth stops, and is retained when the voltage potentials are removed. Such can effectively result in the resistance of the mass of fast ion conductor material between electrodes dropping by a factor of 1,000. Such material can be returned to its highly resistive state by reversing the voltage potential between the anode and cathode, whereby the filament disappears. Again, the highly resistive state is maintained once the reverse voltage potentials are removed. Accordingly, such a device can, for example, function as a programmable memory cell of memory circuitry.

The preferred resistance variable material received between the electrodes typically and preferably comprises a chalcogenide material having metal ions diffused therein. A specific example is germanium selenide having silver ions diffused therein. The present method of providing the silver ions within the germanium selenide material is to initially chemical vapor deposit the germanium selenide glass without any silver being received therein. A thin layer of silver is thereafter deposited upon the glass, for example by physical vapor deposition or other technique. An exemplary thickness is 200 Angstroms or less. The layer of silver is irradiated, preferably with electromagnetic energy at a wavelength less than 500 nanometers. The thin nature of the deposited silver enables such energy to pass through the silver to the silver/glass interface effective to break a chalcogenide bond of the chalcogenide material, thereby effecting dissolution of silver into the germanium selenide glass. The applied energy and overlying silver result in the silver migrating into the glass layer such that a homogenous distribution of silver throughout the layer is ultimately achieved.

Saturation of silver in germanium selenide is apparently at about 35 atomic percent. Yet, preferred existing technology for cell fabrication constitutes a concentration which is less than 35%, for example 27%. By controlling the time of irradiation, the quantity of silver provided within the glass can be desirably controlled to some suitable percent below saturation.

However, once the desired irradiation of the silver/glass composite is completed to achieve the desired silver incorporation, the wavelength of radiation required for further dissolution of the silver greatly reduces, even lowering to that of standard room lighting. This is due to the band gap of the underlying material shifting with increasing silver incorporation. Further, and regardless, the substrate is almost invariably next subjected to photolithographic processing resulting in exposure to actinic energy at wavelengths above standard room lighting, which can undesirably cause more silver to be incorporated into the glass than the desired amount.

It would be desirable to develop ways to prevent or at least reduce this additional undesired silver incorporation into the resistance setable material. While the invention was principally motivated in achieving this objective, it is in no way so limited. The artisan will appreciate applicability of the invention in other aspects of processing involving chalcogenide materials, with the invention only being limited by the accompanying claims as literally worded and as appropriately interpreted in accordance with the doctrine of equivalents.

SUMMARY

The invention includes non-volatile resistance variable devices and methods of forming the same, and methods of precluding diffusion of a metal into adjacent chalcogenide material. In one implementation, a method of precluding diffusion of a metal into adjacent chalcogenide material upon exposure to a quanta of actinic energy capable of causing diffusion of the metal into the chalcogenide material includes forming an actinic energy blocking material layer over the metal to a thickness of no greater than 500 Angstroms and subsequently exposing the actinic energy blocking material layer to said quanta of actinic energy. In one implementation, an homogenous actinic energy blocking material layer is formed over the metal and subsequently exposed to said quanta of actinic energy.

In one implementation, a method of forming a non-volatile resistance variable device includes providing conductive electrode material over chalcogenide material having metal ions diffused therein. An actinic energy blocking material layer is formed on the conductive electrode material, the actinic energy blocking material layer being effective to shield actinic energy from reaching an interface of the conductive electrode material and the actinic energy blocking material to substantially preclude diffusion of the conductive electrode material into the chalcogenide material upon exposure to said actinic energy. A dielectric layer is formed on the actinic energy blocking material layer. The conductive electrode material is formed into a first electrode. A second electrode is provided proximate the chalcogenide material having the metal diffused therein.

Other implementations and aspects are contemplated and disclosed.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
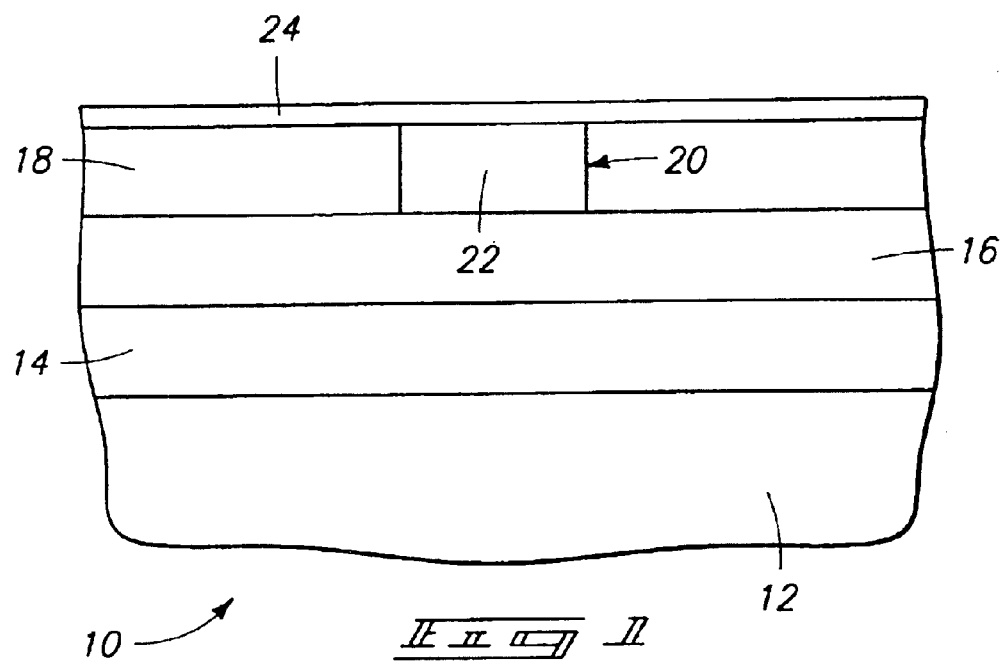
FIG. 1 is a diagrammatic sectional view of a semiconductor wafer fragment in process in accordance with an aspect of the invention.

Referring to FIG. 1, a semiconductor wafer fragment 10 is shown in but one preferred embodiment of a method of forming a non-volatile resistance variable device. By way of example only, example such devices include programmable metalization cells and programmable optical elements of the patents referred to above, further by way of example only, including programmable capacitance elements, programmable resistance elements, programmable antifuses of integrated circuitry and programmable memory cells of memory circuitry. The above patents are herein incorporated by reference. The invention contemplates the fabrication techniques and structure of any existing non-volatile resistance variable device, as well as yet-to-be developed such devices. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated. Further, it will be appreciated by the artisan that "resistance setable semiconductive material" and "resistance variable device" includes materials and devices wherein a property or properties in addition to resistance is/are also varied. For example, and by way of example only, the material's capacitance and/or inductance might also be changed in addition to resistance.

Semiconductor wafer fragment 10 comprises a bulk monocrystalline semiconductive material 12, for example silicon, having an insulative dielectric layer 14, for example silicon dioxide, formed thereover. A conductive electrode material 16 is formed over dielectric layer 14. By way of example only, preferred materials include any of those described in the incorporated Kozicki et al. patents referred to above in conjunction with the preferred type of device being fabricated. A dielectric layer 18 is formed over first electrode 16. Silicon nitride is a preferred example.

An opening 20 is formed through layer 18 to conductive electrode layer 16. Such is filled with a chalcogenide material 22. Example and preferred materials are those disclosed in the Kozicki et al. patents above. Specifically, and by way of example only, preferred chalcogenide materials include $Ge_xA_y$, where "A" is selected from the group consisting of Se, Te and S, and mixtures thereof. An example preferred method of forming material 22 over substrate 10 is by chemical vapor deposition to completely fill opening 20, followed by a planarization technique, for example chemical-mechanical polishing. A metal, shown in the preferred embodiment in the form of a blanket layer 24, is formed over chalcogenide material 22. An example and preferred material for layer 24 is elemental silver. By way of example only, example alternates include gold and copper, although copper is not expected to be usable in the context of the preferred $Ge_xA_y$ programmable metalization cell being fabricated. Layer 24 is preferably deposited to a thickness at least one-third that of the thickness of chalcogenide material 22 received within opening 20.

Figure 2:
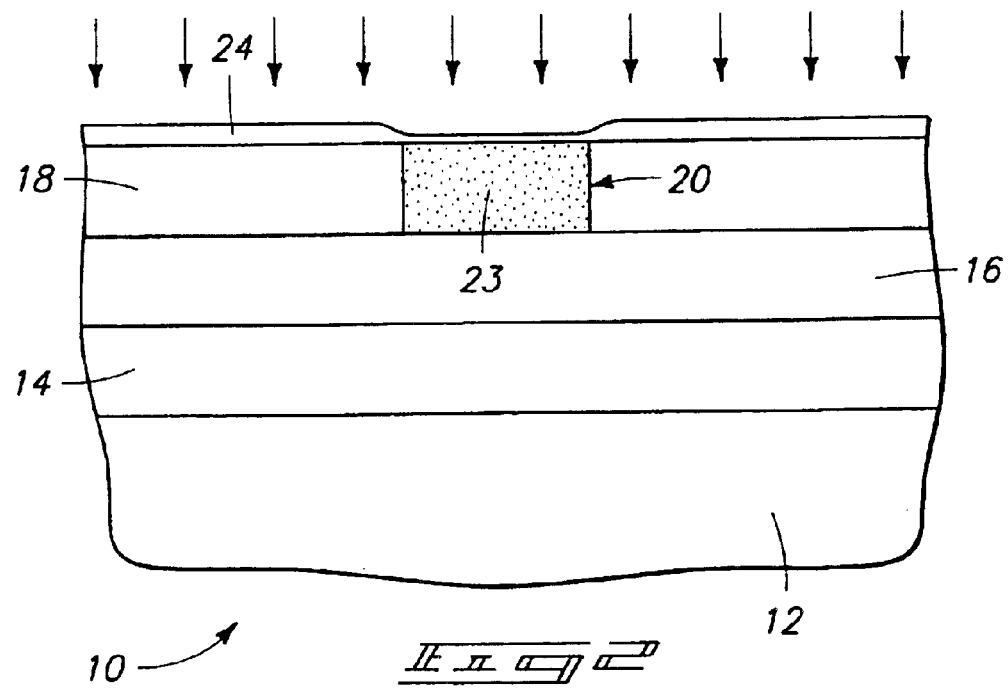
FIG. 2 is a view of the FIG. 1 wafer fragment at a processing step subsequent to that shown by FIG. 1.

Referring to FIG. 2, metal 24 is irradiated effective to break a chalcogenide bond of the chalcogenide material at an interface of metal 24 and chalcogenide material 22, and diffuse at least some of metal 24 into chalcogenide material 22. Material 22 is designated with numeral 23 and peppered in the drawings to indicate metal ions being received therein. A preferred irradiating includes exposure to actinic radiation having a wavelength below 500 nanometers, with radiation exposure at between 404–408 nanometers being a more specific example. A more specific example is a flood UV exposure tool operating at 4.5 milliwatts/cm$^2$ energy, for 15 minutes, in an oxygen containing ambient at room temperature and pressure.

All of material 24 received directly over chalcogenide material 22 might be diffused to within such material, or some portion thereof might remain as is shown. The thickness of layer 24 is also chosen to be suitably thin to enable the impinging electromagnetic radiation to essentially transparently pass through material 24 to the interface of such material with chalcogenide material 22. An example preferred range for the thickness of layer 24 is from about 140 Angstroms to about 200 Angstroms.

Figure 3:
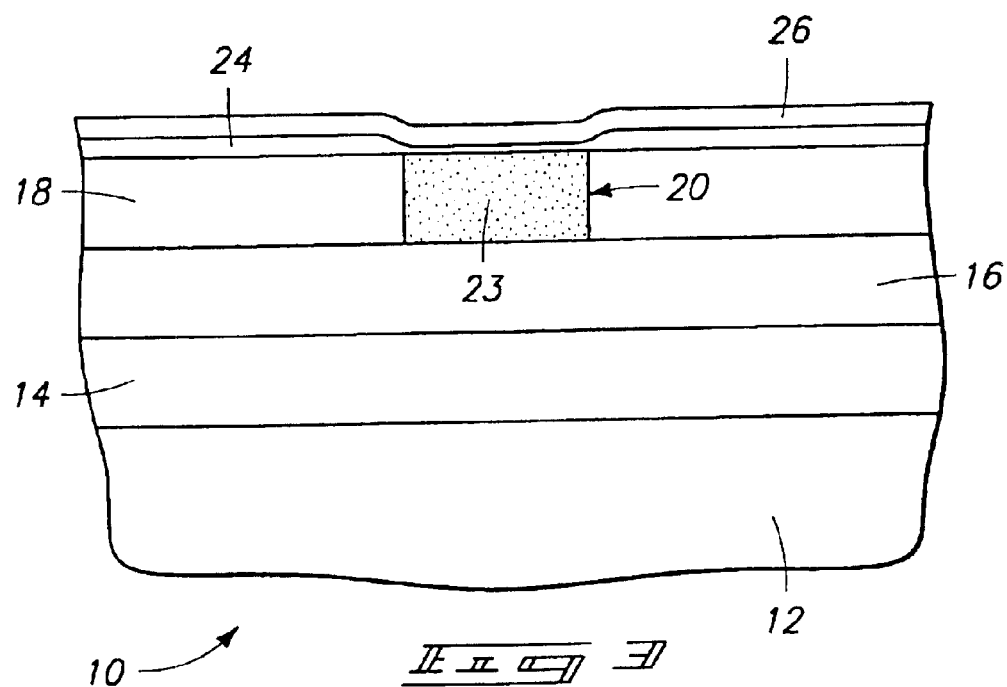
FIG. 3 is a view of the FIG. 1 wafer fragment at a processing step subsequent to that shown by FIG. 2.

Referring to FIG. 3, after the irradiating, conductive electrode material 26 is formed over chalcogenide material 23 having the metal diffused therein. An example preferred thickness range for electrode material 26 is from 140 Angstroms to 200 Angstroms. Layer 26 and any remnant metal 24 received directly over chalcogenide material 23 will constitute one electrode of the resistance variable device being fabricated, with layer 16 constituting another or second electrode for the device. In accordance with the preferred programmable metalization cell embodiment, at least one of electrode 26/24 and electrode 16 will constitute silver in contact with chalcogenide material 23. Example preferred materials for layer 26 include silver, tungsten and tungsten nitride. Further in the context of this document, any remnant material 24 received over chalcogenide material 23 will form a part of the upper electrode as shown, and accordingly, inherently constitutes conductive electrode material. Accordingly, in the illustrated FIG. 3 embodiment, conductive electrode material 24/26 received over chalcogenide material 23 constitutes two individual layers 24 and 26. In a preferred embodiment, both preferably comprise the same material, specifically silver, and particularly where lower electrode 16 comprises a material other than silver.

Figure 4:
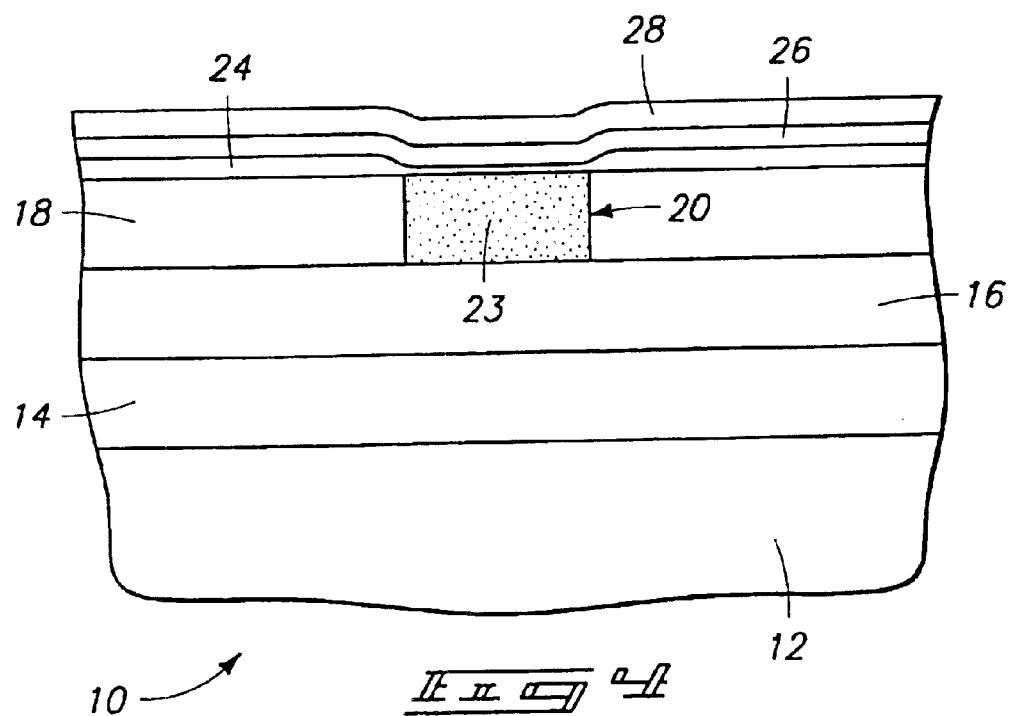
FIG. 4 is a view of the FIG. 1 wafer fragment at a processing step subsequent to that shown by FIG. 3.

Referring to FIG. 4, an actinic energy blocking material layer 28 is formed on conductive electrode material 26/24. In the preferred embodiment, such material layer is effective to shield actinic energy from reaching the interface of materials 26/24 and chalcogenide material 23 to substantially preclude diffusion of metal 24 into chalcogenide material 23 upon exposure to said actinic energy. In one preferred embodiment, layer 28 is insulative. In another preferred embodiment, layer 28 is conductive, thereby forming a part of the illustrated upper electrode. Further in one embodiment, the actinic energy blocking material is actinic energy reflective. In another preferred embodiment, the actinic energy blocking material is actinic energy absorptive and thereby antireflective. By way of example only, example conductive and reflective actinic energy blocking materials include tungsten and tungsten nitride. By way of example only, example actinic energy blocking materials which are both absorptive and insulative include amorphous silicon, silicon oxynitride, silicon-rich silicon nitride, and silicon-rich silicon dioxide.

In the preferred embodiment where a programmable metalization cell is being fabricated which comprises germanium selenide having silver therein, the deposition temperature for providing or otherwise forming layer 28 is preferably at or below 130° C. This is desirable to maintain the preferred embodiment germanium selenide material in a desired operative substantially amorphous state. Actinic energy blocking material 28 is preferably formed to a thickness no greater than 500 Angstroms, and preferably no thinner than 100 Angstroms. Further, actinic energy blocking layer 28 is preferably homogenous in composition, and constitutes a singular layer. Note also that the illustrated layer 26 might be fabricated to constitute an actinic energy blocking material (with or without additional layers) where at least some metal 24 remains over chalcogenide material 23 after the irradiating. In the preferred embodiment, the actinic energy blocking material layer enables the device to be subjected or otherwise exposed to actinic energy which would otherwise be effective to cause more diffusion of metal 24 into chalcogenide material 23, but which is substantially precluded by provision of the actinic energy blocking material.

Figure 5:
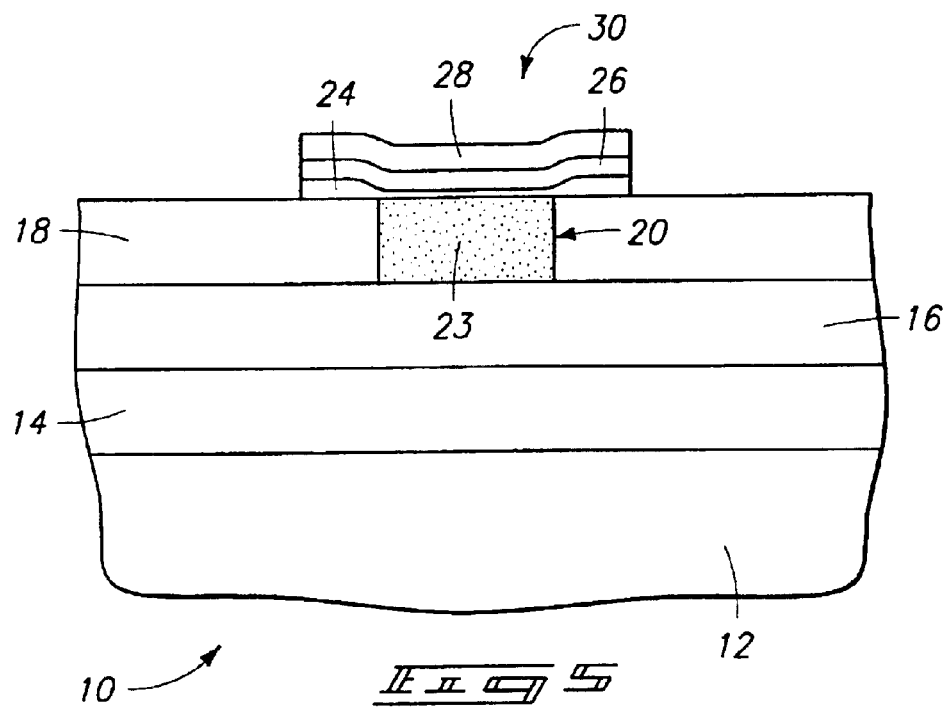
FIG. 5 is a view of the FIG. 1 wafer fragment at a processing step subsequent to that shown by FIG. 4.

Referring to FIG. 5, materials 28, 26 and 24 are patterned into an electrode 30. Where layer 28 constitutes conductive material, such forms a part of electrode 30. Where layer 28 comprises an insulative material, such effectively does not constitute a part of the conductive electrode 30, but rather constitutes an insulative material layer received thereover. Patterning to produce electrode 30 is typically and preferably conducted utilizing photolithography whereby actinic energy blocking material layer 28 is inherently exposed to actinic energy, with layer 28 substantially precluding further diffusion of metal layer 24 into chalcogenide material 23.

Figure 6:
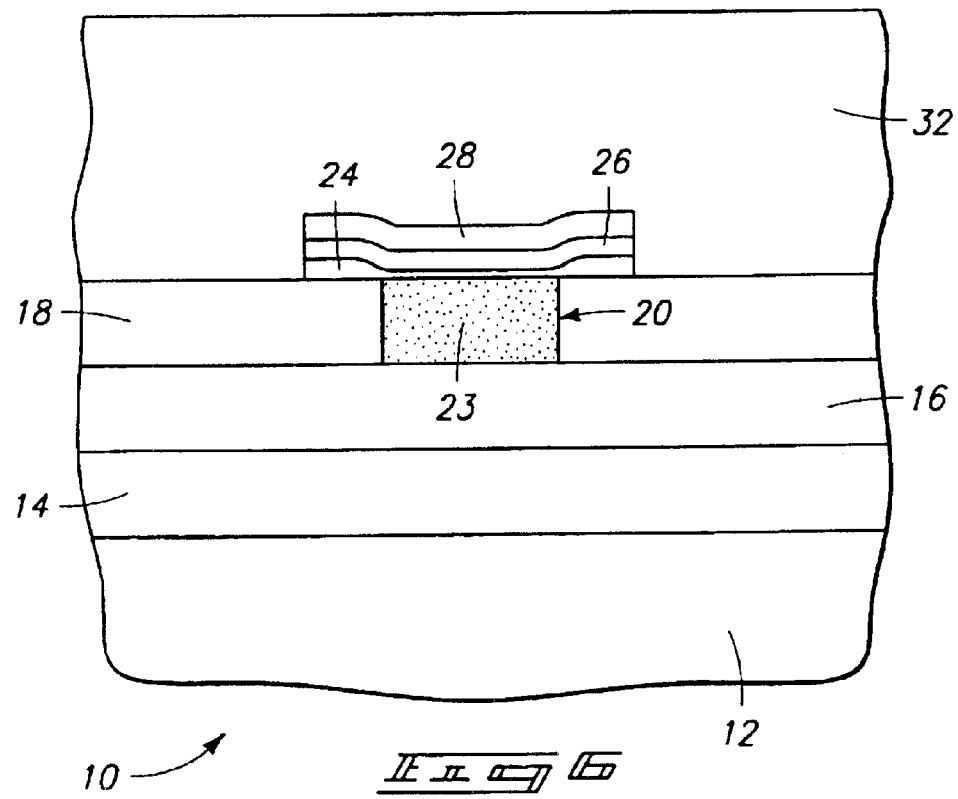
FIG. 6 is a view of the FIG. 1 wafer fragment at a processing step subsequent to that shown by FIG. 5.

Referring to FIG. 6, one or more dielectric layers 32 are ultimately formed over actinic energy blocking material layer 28. Of course, intervening conductive and semiconductive layers might also be provided to form other lines and devices outwardly of the depicted device 30.

Independent of the method of fabrication, the invention comprises a non-volatile resistance variable device comprising some substrate having a first electrode formed thereover, for example either electrode 30 or electrode/layer 16. A resistance variable chalcogenide material 23 having metal ions diffused therein is received operatively adjacent the first electrode. A second electrode, for example the other of electrode 30 or electrode/layer 16, is received operatively adjacent the resistance variable chalcogenide material. In one embodiment, an actinic energy blocking material layer is received on the electrode to a thickness of no greater than 500 Angstroms. In one embodiment, a substantially homogenous actinic energy blocking material layer is received on the electrode independent of thickness. Preferably, the actinic energy blocking material layer is both substantially homogenous and of a thickness no greater than 500 Angstroms. In the preferred embodiment, the device is configured as a programmable memory cell, for example the programmable metalization cell as described above.

The invention also constitutes a non-volatile resistance variable device independent of actinic energy blocking effects. In one implementation, such a device comprises a first layer of material which is received on the electrode to a thickness of no greater than 500 Angstroms, with such material being any one or combination of amorphous silicon, silicon oxynitride, silicon-rich silicon nitride, silicon-rich silicon dioxide, tungsten and tungsten nitride. In one embodiment, such a non-volatile resistance variable device comprises a first homogenous layer of material received on the electrode, with such material constituting one or more of amorphous silicon, silicon oxynitride, silicon-rich silicon nitride, silicon-rich silicon dioxide, tungsten and tungsten nitride.

Further, the invention, independent of the device being fabricated, comprises in one embodiment a method of precluding diffusion of a metal into adjacent chalcogenide material upon exposure to a quanta of actinic energy capable of causing diffusion of the metal into the chalcogenide material. In one implementation, such inventive method comprises forming an actinic energy blocking material layer over the metal to a thickness of no greater than 500 Angstroms and subsequently exposing the actinic energy blocking material layer to said quanta of actinic energy. In one implementation, such method includes forming a homogenous actinic energy blocking material layer over the metal and subsequently exposing the actinic energy blocking material layer to said quanta of actinic energy. Most preferably, the actinic energy blocking material layer is both homogenous and provided to a thickness of no greater than 500 Angstroms.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A resistance variable device comprising:
   a semiconductor substrate;
   a first dielectric layer formed over said semiconductor substrate;
   a first conductive layer formed over said dielectric layer;
   a second dielectric layer formed over said first conductive layer, said second dielectric layer having an opening exposing said first conductive layer, wherein said opening is filled with a chalcogenide material having metal ions diffused therein;
   a second conductive layer formed over said first dielectric layer and said chalcogenide material; and
   an actinic energy blocking material layer formed over said second conductive layer.

2. The device of claim 1, wherein said device is configured to be a programmable memory cell.

3. The device of claim 1, wherein said second conductive layer is about 140 to about 200 Angstroms thick.

4. The device of claim 1, wherein said actinic energy blocking material layer is about 100 to about 500 Angstroms thick.

5. The device of claim 4, wherein said actinic energy blocking material layer is actinic energy reflective.

6. The device of claim 4, wherein said actinic energy blocking material layer is actinic energy absorptive.

7. The device of claim 1, wherein said actinic energy blocking material layer is insulative.

8. The device of claim 1, wherein said actinic energy blocking material layer is conductive.

9. A resistance variable device comprising:
   a semiconductor substrate;
   a first conductive layer formed over said semiconductor substrate;
   a chalcogenide layer formed over said first conductive layer;
   a second conductive layer formed over said chalcogenide layer, wherein at least a portion of said second conductive layer is diffused into portions of said chalcogenide layer;
   a third conductive layer formed over said second conductive layer; and
   an actinic energy blocking material layer formed over said third conductive layer.

10. The device of claim 9, further comprising a first dielectric layer formed between said first conductive layer and said semiconductor substrate.

11. The device of claim 10, further comprising a second dielectric layer formed between said first conductive layer and said chalcogenide layer, wherein at least a portion of said chalcogenide layer remains in contact with said first conductive layer.

12. The device of claim 9, wherein said second conductive layer comprises silver.

13. The device of claim 12, wherein said second conductive layer is formed to be about one-third as thick as said chalcogenide layer.

14. The device of claim 12, wherein said second conductive layer is formed to about 140 to about 200 Angstroms thick.

15. The device of claim 9, wherein said third conductive layer is formed to about 140 to about 200 Angstroms thick.

16. The device of claim 9, wherein said first conductive layer is a bottom electrode.

17. The device of claim 16, wherein said second and third conductive layers are patterned to be a top electrode.

18. The device of claim 16, wherein said second and third conductive layers and said actinic energy blocking material layer are patterned to be a top electrode.

19. The device of claim 18, wherein said actinic energy blocking material layer is conductive.

20. The device of claim 19, wherein said actinic energy blocking material layer comprises tungsten.

21. The device of claim 19, wherein said actinic energy blocking material layer comprises tungsten nitride.

22. The device of claim 9, wherein said actinic energy blocking material layer is about 100 to about 500 Angstroms thick.

23. The device of claim 9, wherein said actinic energy blocking material layer is insulative.

24. A resistance variable device comprising:
   a semiconductor substrate;
   a first conductive layer formed over said semiconductor substrate;
   a chalcogenide layer formed over said first conductive layer with metal ions diffused therein;
   a second conductive layer formed over said chalcogenide layer; and
   an actinic energy blocking material layer formed over said second conductive layer, wherein said actinic energy blocking material layer is homogenous in composition.

25. The device of claim 24, further comprising a first dielectric layer formed between said first conductive layer and said semiconductor substrate.

26. The device of claim 25, further comprising a second dielectric layer formed between said first conductive layer and said chalcogenide layer, wherein at least a portion of said chalcogenide layer remains in contact with said first conductive layer.

27. The device of claim 24, wherein said second conductive layer is part of a top electrode.

28. The device of claim 24, wherein said first conductive layer is part of a bottom electrode.

29. The device of claim 24, wherein said second conductive layer is formed to about 140 to about 200 Angstroms thick.

30. The device of claim 24, wherein said actinic energy blocking material layer is about 100 to about 500 Angstroms thick.

31. The device of claim 30, wherein said actinic energy blocking material layer is conductive.

32. The device of claim 30, wherein said actinic energy blocking material layer is insulative.

* * * * *